(12) United States Patent
Sidhwa

(10) Patent No.: US 6,291,337 B1
(45) Date of Patent: *Sep. 18, 2001

(54) ELIMINATION OF CRACKS GENERATED AFTER A RAPID THERMAL PROCESS STEP OF A SEMICONDUCTOR WAFER

(75) Inventor: Ardehsir J. Sidhwa, Scottsdale, AZ (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/027,357

(22) Filed: Feb. 20, 1998

(51) Int. Cl.[7] ............................................. H01L 21/4763
(52) U.S. Cl. ........................................... 438/627; 438/663
(58) Field of Search .................................. 438/663, 190, 438/192, 660, 625, 627; 430/5; 437/200; 357/71

(56) References Cited

U.S. PATENT DOCUMENTS

| | | | | |
|---|---|---|---|---|
| 4,782,380 | * | 11/1988 | Shankar et al. | 357/71 |
| 5,094,981 | * | 3/1992 | Chung et al. | 437/190 |
| 5,464,711 | * | 11/1995 | Mogab et al. | 430/5 |
| 5,489,367 | * | 2/1996 | Kubota et al. | 204/192.15 |
| 5,686,359 | * | 11/1997 | Meester et al. | 437/200 |
| 5,973,408 | * | 10/1999 | Nagasaka et al. | 257/915 |
| 6,059,872 | * | 5/2000 | Ngan et al. | 106/286.8 |

* cited by examiner

Primary Examiner—Matthew Smith
Assistant Examiner—Calvin Lee
(74) Attorney, Agent, or Firm—David V. Carlson; Theodore E. Galanthay; Lisa K. Jorgenson

(57) ABSTRACT

Two improved process steps of eliminating cracks within TiN and/or BPSG layers after the RTP process are provided. The first is to provide a low deposition power, preferably below 6.5 KWH, and a high process pressure, preferably above 5.6 mTorr, to the TiN layer. No crack is found for this improved TiN deposition process when the RTP temperature rises from 450° C. to about 700° C. The second is to provide a low RTP temperature, preferably below 595° C., to the semiconductor wafer. No crack, again, is found by using this low RTP temperature.

18 Claims, 5 Drawing Sheets

ELIMINATION OF CRACKS GENERATED AFTER A RAPID THERMAL PROCESS STEP OF A SEMICONDUCTOR WAFER

TECHNICAL FIELD

This invention relates generally to semiconductor devices, and more particularly, to an improved process to eliminate cracks occurred during manufacturing a semiconductor wafer. Specifically, this invention relates to using an optimal temperature in a rapid thermal annealing (RTA or RTP) process or using an improved deposition process of a titanium nitride (TiN) layer before the RTA process to ensure cracks are not introduced into the TiN layer deposited on the semiconductor wafer.

BACKGROUND OF THE INVENTION

The electronic industry has long used an ion implantation technique to dope desired impurities into a semiconductor wafer. The ion implantation technique provides a much better control of a doping profile than other diffusion-type doping processes, such as, e.g., a chemical vapor deposition (CVD) process. However, during the ion implantation process, damages will be inevitably introduced into a crystal structure of the semiconductor wafer due to the bombardment of doping ions into the semiconductor wafer. The damages to the crystal structure of the semiconductor wafer will cause adverse effects on performance of chip products made from the semiconductor wafer. Annealing processes are thus needed to restore the crystal damages of the semiconductor wafer.

During the annealing process, annealing conditions, such as, e.g., temperature and time period of the annealing process, should be controlled precisely, otherwise, implanted dopants will diffuse within the semiconductor wafer and cause the desirable doping profile to be lost. Rapid thermal process (RTP), also called rapid thermal annealing (RTA), technology is therefore designed to provide an annealing process without losing the desired doping profile made by ion implantation.

The RTA technology offers fast surface heating that restores the damages of crystal without a substrate temperature of the wafer rising to a diffusion level for the implanted dopants. In addition, the RTA process can take place in seconds while a conventional tube thermal process used in annealing wafers may take from 15 to 30 minutes. The RTA technology is based on a principle of radiation heating where the semiconductor wafer to be annealed is placed in a chamber fitted with gas inlets and exhaust outlets. Inside the gas chamber, a heat source above, and possibly below, the wafer provides the rapid heating of RTA process. Tungsten halogen lamps or graphite heaters are examples, among others, used in the electronic industry for heat sources of the RTA technology. Because of its very short heating times with radiation heating, the body of the wafer never comes up to the dopant-diffusion temperature. Further, every time a wafer is heated and cooled in an annealing process, RTA or not, more crystal damages might be formed in the wafer. By minimizing a total annealing time and thermal budget, the RTA process allows more dense designs and fewer failures from crystal damages of the wafer. The RTA technology thus offers an ideal mean of annealing the crystal damages while maintaining the desirable doping profiled made by ion implantation.

Experiments performed by the inventors found that the conventional RTA process has introduced cracks into the semiconductor wafer, particularly to a titanium (Ti), titanium nitride (TiN) or a titanium nitride on titanium (TiN/Ti) barrier layer deposited over a boron phosphorus silicate glass (BPSG) layer on the semiconductor wafer.

Ti, TiN or TiN/Ti barrier layer acts as a glue for metal plugs or later metal layers, such as tungsten or aluminum plugs, used as contact plugs, via layers, in a semiconductor. Ti, TiN or TiN/Ti layers are also commonly used as a contact "barrier" for tungsten plugs or aluminum plugs of metal contacts for semiconductor devices to prevent spiking and alloying between an aluminum or tungsten interconnection and the silicon surface. Cracks created on the TiN or TiN/Ti barrier layer after the RTA process will thus destroy functionality, such as causing junction leakage problems, of the chip products and consequently reduce the yield rate of the semiconductor wafer. Experiments by the inventors show that cracks are particularly prevalent at the edge of the wafer and at deep contacts in the device.

An object to this invention is to provide an improved process for manufacturing semiconductor wafers thereby to eliminate all, or almost all, cracks causes to the wafer, and the chip products built on the wafer, during the RTA process.

SUMMARY OF THE INVENTION

A first embodiment of the present invention provides an improved process of a preferred temperature adopted during the RTA process to the semiconductor wafer.

According to principles of the present invention, in a first embodiment, the rapid thermal anneal temperature was kept below 600° C. The titanium layer and the TiN/Ti barrier was deposited without changing the titanium nitride formation conditions. Using the standard formation process conditions, rapid thermal anneal was carried out at a much lower temperature than previously used, less than 600° C. Preferably, the RTA temperature was in the range of 635° C. –590° C. The temperature may also be in the range of 570° C. –595° C.

Another embodiment of the present invention provides an improved deposition process for the TiN or TiN/Ti barrier layer so that it will not cause cracks during the RTA process.

According to another embodiment of the present invention, the process conditions for forming the titanium layer are modified to ensure that after the rapid thermal anneal, the tensile stress is lower than a selected amount. This is accomplished by using a lower deposition power than previously used, preferably in the range of 5.0–6.5 KW and, according to one embodiment, below 6.0 KW and in the range of 5.7–6.0 KW.

The features and advantages of the invention will be apparent from the following description of embodiments thereof, given by way of non-limitative examples with reference to the accompanying drawings.

Experiments performed by the inventors found that the conventional RTA process has introduced cracks into the semiconductor wafer, particularly to a titanium (Ti), titanium nitride (TiN) or a titanium nitride on titanium (TiN/Ti) barrier layer deposited over a boron phosphorus silicate glass (BPSG) layer on the semiconductor wafer.

Ti, TiN or TiN/Ti barrier layer acts as a glue for metal plugs or later metal layers, such as tungsten or aluminum plugs, used as contact plugs, via layers, in a semiconductor. TiN or TiN/Ti layer are also commonly used as a contact "barrier" for tungsten plugs or aluminum plugs of metal contacts for semiconductor devices to prevent spiking and alloying between an aluminum or tungsten interconnection and the silicon surface. Cracks created on the TiN or TiN/Ti barrier layer after the RTA process will thus destroy functionality, such as causing junction leakage problems, of the chip products and consequently reduce the yield rate of the semiconductor wafer. Experiments by the inventors show that cracks are particularly prevalent at the edge of the wafer and at deep contacts in the device. One advantage of the present invention is that cracks are not created in the Ti, TiN or TiN/Ti layers. Therefore, possible cracking of underlying dielectric layers such as a ESPG layer is also prevented. This creates increased reliability in existing die and significantly increases yields of good die from the entire chip.

DETAILED DESCRIPTION OF THE INVENTION

Figure 1:
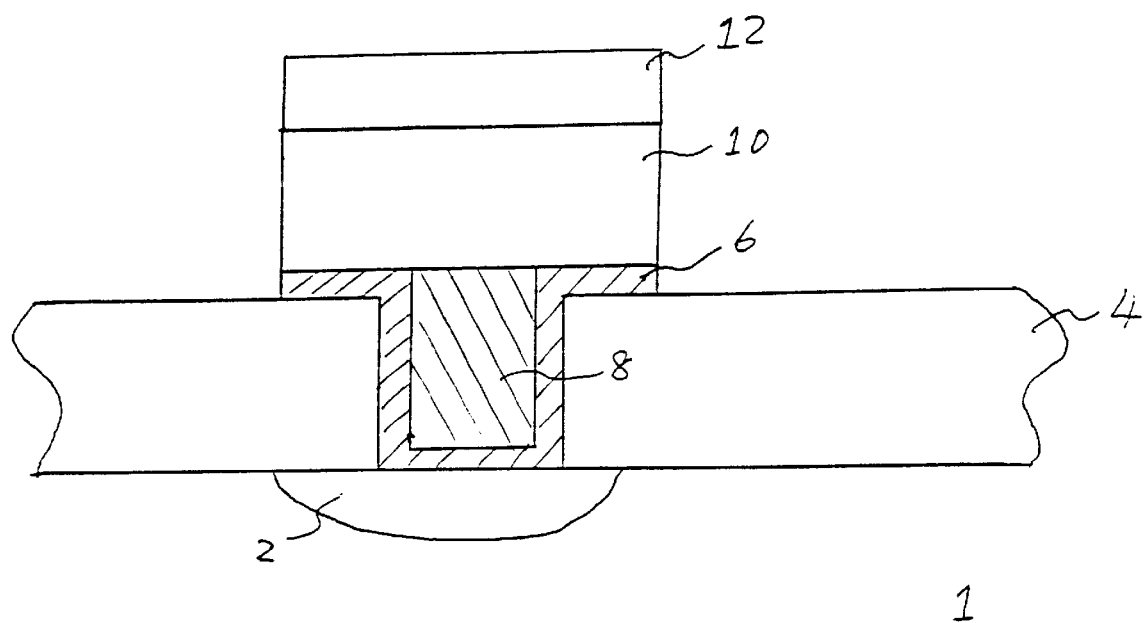
FIG. 1 shows a basic structure of a part of a semiconductor device having a BPSG and a TiN/Ti or TIN barrier layer known to the prior art.

FIG. 1 illustrates a simplified contact structure known in the art. A contact region 2 is formed within a semiconductor substrate 1 or in the intermediate layer, such as metal 1 to metal 2. A number of layers may be formed as part of the semiconductor structure, such as field oxide, gate poly, interconnects, etc., which are not shown here for simplicity. At an upper dielectric layer 4 a BSPG is then formed. A contact opening is subsequently created by etching the dielectric layer 4, usually a BPSG, above the contact region 2. An adhesive layer 6 of titanium (Ti) is then deposited. This can be followed by a titanium nitride (TiN) or a titanium nitride on titanium stack (TiN/Ti) over the BPSG layer and also within the contact opening. The stack is referred to herein as TiN/Ti, even though it may comprise a Ti layer with TiN or various contribution layers. After depositing the TiN/Ti barrier layer, a contact plug 8, preferably an aluminum or a tungsten plug, is deposited into the contact opening. An interconnection layer 10 is thereafter deposited over the contact opening, and finally an oxide layer 12 is deposited over the interconnection layer 10. These steps are well known in the art and literature and need not be described.

Figure 2:
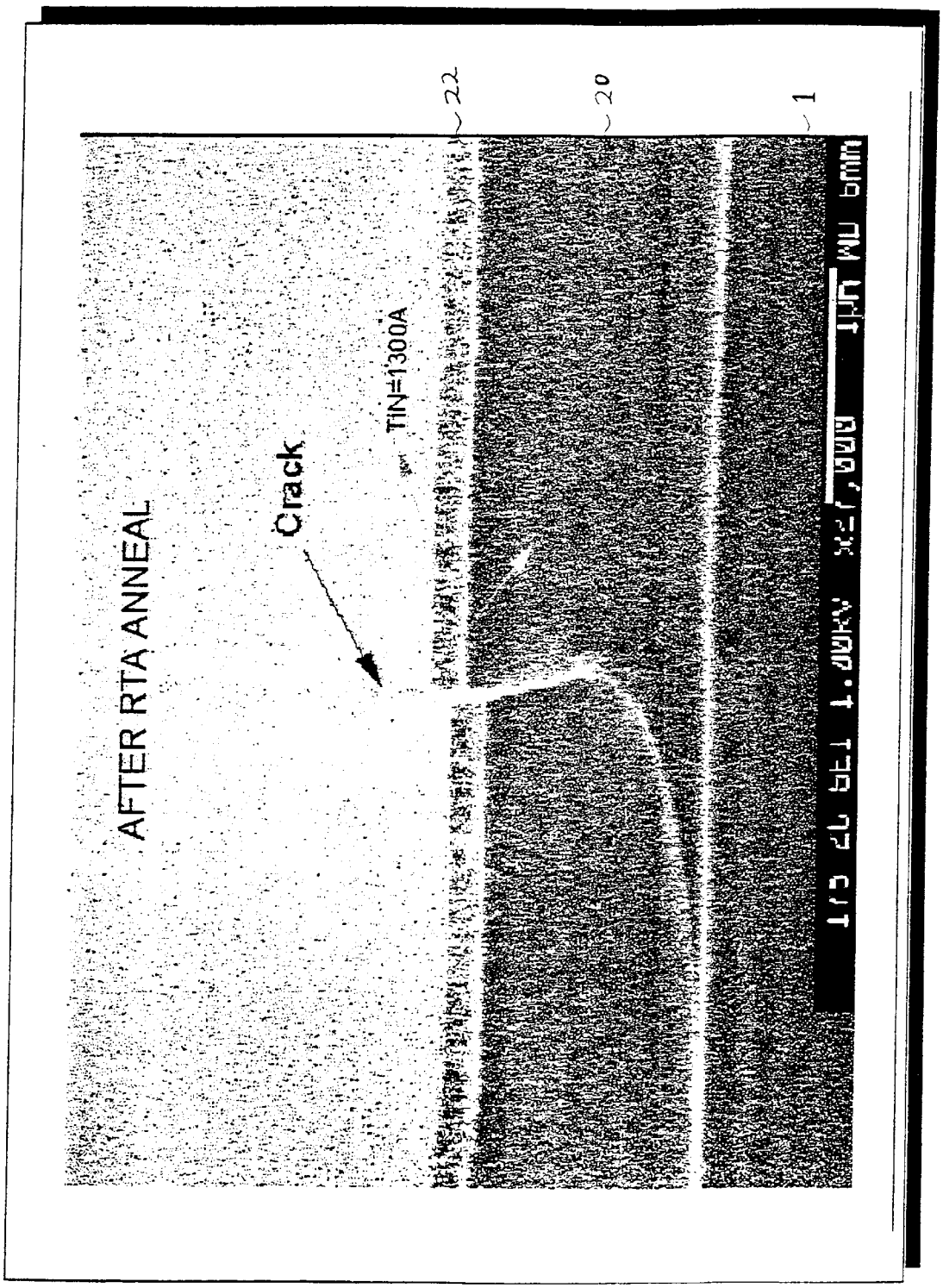
FIG. 2 shows an SEM cross-section picture illustrating a crack occurred in the TiN and BPSG layers.

FIG. 2 shows an SEM cross-section picture of a crack originating from a titanium nitride (TiN) barrier layer 22 all the way to the bottom of a boron phosphorus silicate glass layer (BPSG) 20. The (TiN/Ti) stack layer is commonly used as a glue layer and/or contact barrier for tungsten or aluminum layers or plugs of a semiconductor device. It is imperative to have a good quality of TiN/Ti and/or BPSG layers to prevent junction current leakage problem. As there are more than a million circuits in today's integrated circuit chip, any one defective circuit of the integrated circuit chip might render the entire integrated circuit chip unusable.

As mentioned above, the BPSG layer is deposited before the TiN/Ti barrier layer. The deposition of the BPSG layer is followed by an RTA reflow process. The stress level of the BPSG layer can be measured before and after the RTA reflow step for the BPSG layer.

Figure 3:
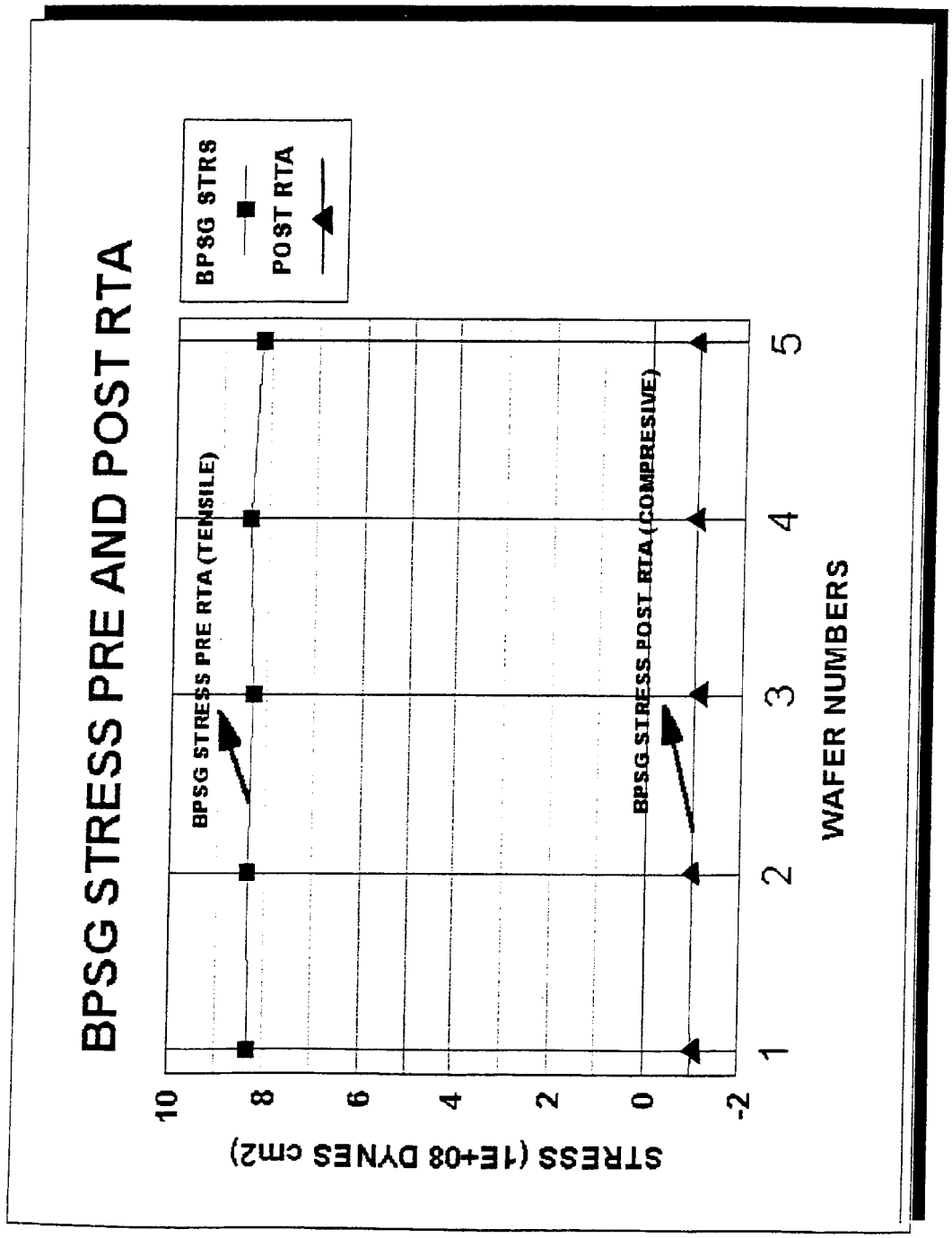
FIG. 3 shows stress levels of the BPSG layer among five wafers both pre and post the RTA process step for the BPSG only.

As shown in FIG. 3, a tensile stress is found before the RTA reflow step on BPSG and a compressive stress is present in the BPSG after the RTA reflow step. FIG. 3 also shows the stress level of BPSG layers of five semiconductor wafers are all reduced from about 8.5E+8 dynes/cm$^2$ (tensile) pre RTA step to about $-1.0$E+8 dynes/cm$^2$ (compressive) post RTA step. After the RTA reflow step for the BPSG layer, the TiN/Ti barrier layer will then subsequently be deposited over the BPSG layer.

Cracks are created due to a high tensile stress level within the TiN/Ti or TiN barrier layer. Different RTA annealing temperatures will cause different stress levels within the TiN/Ti barrier layer, whereas the higher the RTA temperature the higher stress level will be present. According to the present invention, it is important to maintain low tensile stress of the TiN/Ti barrier layer following the RTA process to prevent cracks in the TiN/Ti.

Figure 4:
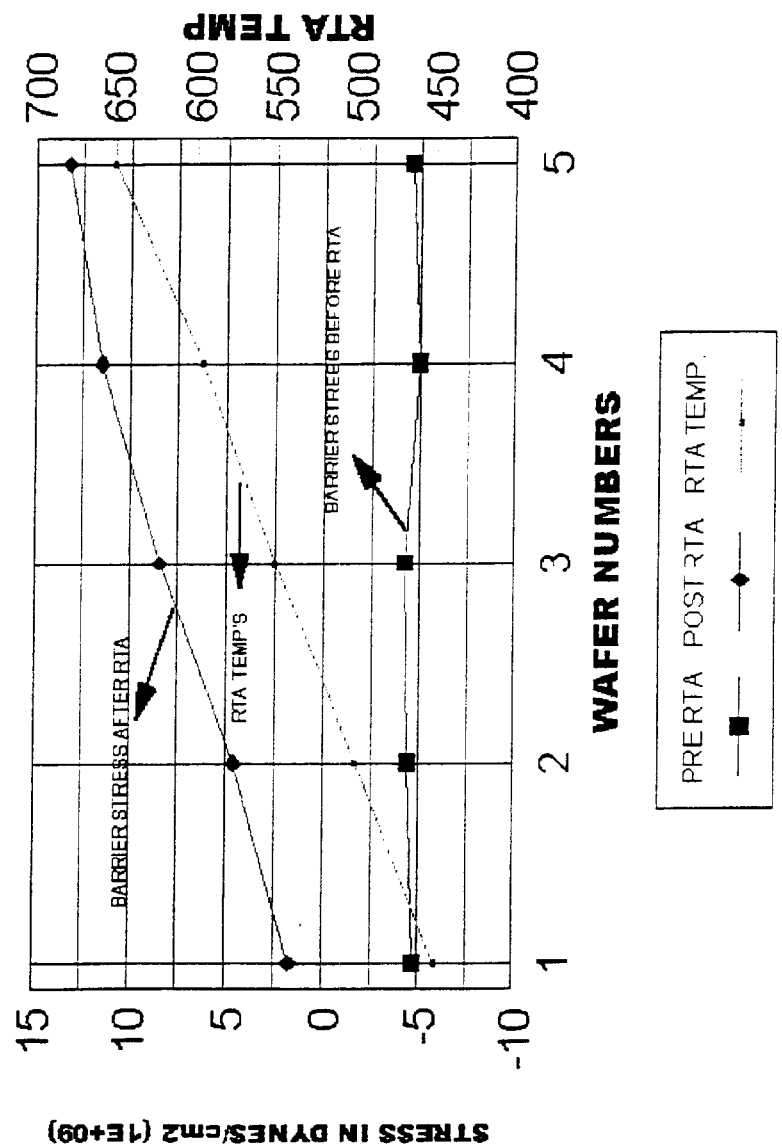
FIG. 4 shows stress levels of the conventionally formed TiN/Ti barrier layers of five wafers both pre and post RTA process step in responding to different RTA process temperature according to the present invention.

FIG. 4 shows a barrier stress rising from about 2.0E+9 dynes/cm$^2$ tensile to 1.3E+10 dynes/cm$^2$ tensile when the RTA process temperature rises from about 450° C. to about 700° C. FIG. 4 also illustrates that before the RTA process the barrier stress of all five wafers are at about $-5.0$E+9 dynes/cm$^2$ compressive level. Experiments show that when the barrier stress level of the TiN/Ti barrier layer rises above 1.25E+10 dynes/cm$^2$ tensile level cracks will normally happen at various places on the semiconductor wafer. Cracks are often more prevalent on the edge than on the center of the wafer. That is because during the reflow process the BPSG reflowed on the edge of the wafer is worse as compared to the center of the wafer thereby at the edge of the wafer there are many hills and crests causing a highly tensile barrier layer to crack after the RTA process.

From FIG. 4, it is clear that the TiN/Ti barrier stress increases relative to the increase in the RTA process temperature. Experiments show that when the RTA process temperature is reduced to about 595° C. no crack is found on the wafers. However, the leakage current may increase to above 400 nAnp level when the RTA process temperature is reduced to about 595° C.

In one embodiment, the Ti layer at the bottom is at about 400 Å, but the thickness of the TiN layer over the Ti layer varies. Experiments also show that a TiN layer with 1300 Å thickness has lower barrier stress by almost 1000 dynes/cm$^2$ comparing to a TiN layer with 800 Å thickness. However, a TiN layer with 1300 Å thickness has basically a same barrier stress with that of a TiN layer with 1000 Å thickness. According to some thinking, it would be expected that for a thicker TiN layer, there would be higher stress after the RTA step. According to a preferred embodiment of the present invention, a thickness in the range of 1000–1300 Å is preferred. Alternatively, a thinner TIN structure, approximately 800 Å or less can be used.

In one embodiment of the invention, the RTA process temperature is set at around 595° C. and the thickness of the TiN barrier layer is set at around from 1000 Å to around 1300 Å. Under this embodiment of the invention, cracks are not present on any wafers processed under this RTA process condition.

Figure 5:
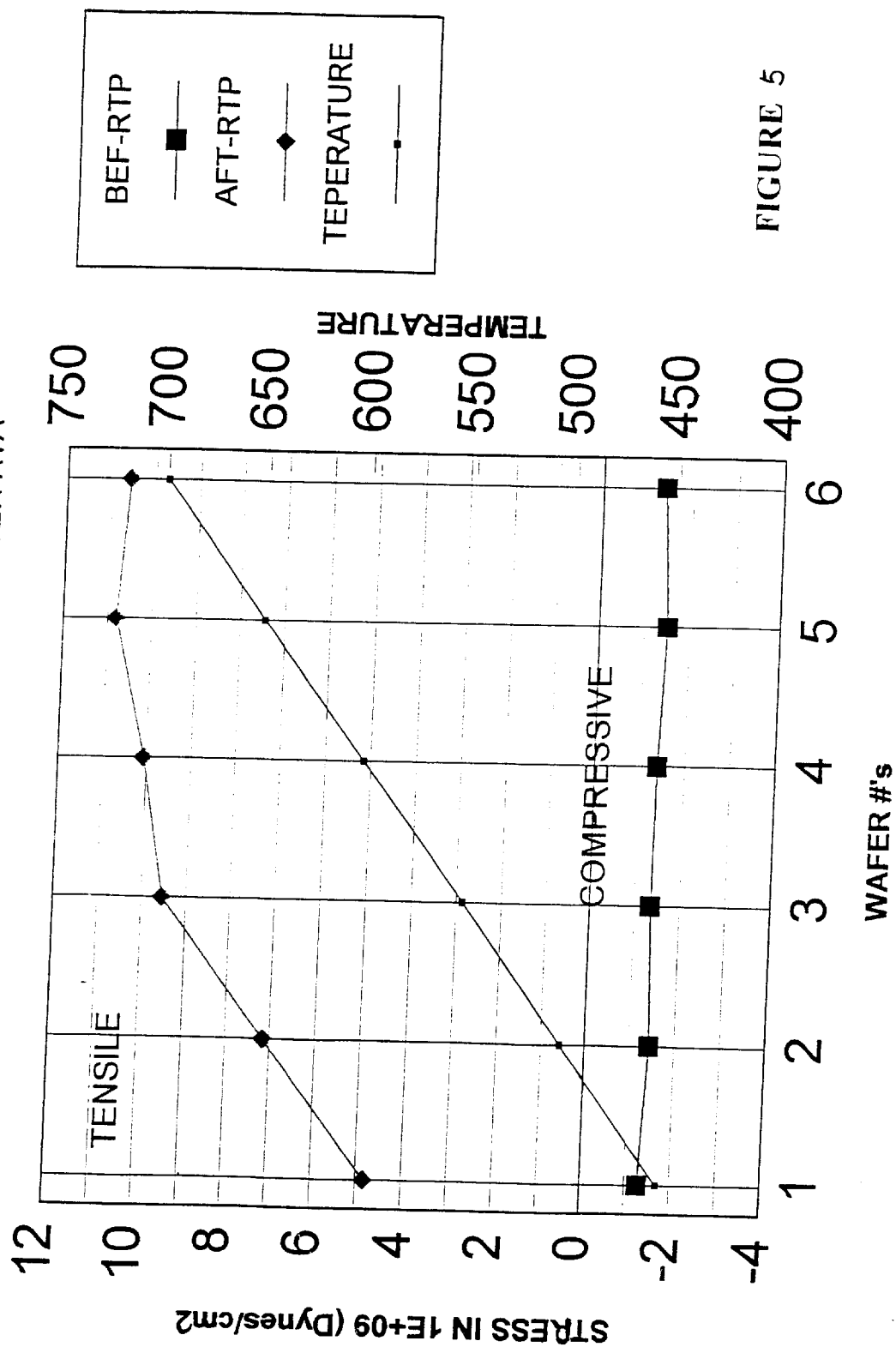
FIG. 5 shows pre and post RTA process stress levels of the TiN/Ti barrier layers formed according to new deposition steps of the TIN/Ti barrier layer of the present invention.

In alternative embodiment, the TiN/Ti barrier layer is deposited by using low deposition power, preferably at around 6.5 KW or below, and high process pressure, preferably at around 5.6 mTorr or above. Traditionally, the TiN/Ti barrier layer is deposited at around 9.0 KW power and around 4.1 mTorr pressure. By using this modified TiN/Ti deposition process, the barrier stress of the TiN/Ti barrier layer is notably lower, as compared to the previous conventional process, particularly in the high RTA temperature range of 600° C. and above, as shown in FIG. 5. All other process steps of manufacturing the semiconductor devices, such as, e.g., EPROMs or EEPROMs, are not discussed here because they are conventional.

The high process pressure of the preferred embodiment of the present invention is primarily accomplished by increasing a chamber pressure of an inert gas, preferably argon, to about 50 sccm. A nitrogen gas pressure of the present invention is maintained at about 85 sccm and a ratio of the nitrogen gas to a titanium gas is maintained at about, or above, 0.97 level. After adopting the improved TiN deposition process of the present invention, the RTA temperatures may exceed 650–700° C. and no crack is found on the semiconductor wafer.

While various embodiments have been described in this application for illustrative purpose only, the claims are not limited to these embodiments. Many modifications can be made to the structure or the process procedures shown and described herein. The claims are intended to be read as broadly as the invention of the prior art permits. For example, other type of semiconductor devices or deposition power and pressure of the above-mentioned manufacturing process may be substituted for those taught herein in achieving the spirit and/or scope of the invention. Any material suitable to perform a desirable function to the semiconductor devices may also be adopted to the present invention without changing the spirit and scope of the invention.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method comprising:
   depositing a dielectric layer on a surface of a semiconductor wafer;
   depositing a titanium nitride layer over the dielectric layer, said layer being deposited with a process pressure that is higher than 5 m Torr; and with a DC deposition power in the range of 5.0 KW to 6.5 KW while maintaining a ratio of nitrogen gas to titanium gas at or above the 0.97 level;
   annealing the semiconductor device; and
   depositing an interconnection layer over the titanium nitride layer.

2. The method of claim 1, wherein a titanium layer is immediately below the titanium nitride layer such that the titanium layer is directly on the dielectric and the titanium nitride layer is directly on the titanium layer.

3. The method of claim 1, wherein the DC deposition power is in the range of 5.7 to 6.0 KW kilowatt and the process pressure is at or above 5.5 mTorr.

4. The method of claim 1, wherein the dielectric layer is a boron phosphorus silicate glass (BPSG) layer.

5. The method of claim 1, wherein the interconnection layer includes an aluminum or a tungsten layer.

6. The method of claim 1, wherein the step of annealing is accomplished by a rapid thermal annealing process.

7. The method of claim 1, wherein the high process pressure of the step of depositing the adhesive layer is accomplished by increasing an inert gas flow to about 50 sccm.

8. The method of claim 7, wherein the inert gas is Argon.

9. The method of claim 1, wherein a nitrogen gas pressure for the high process pressure is at about 85 sccm and the nitrogen gas to a titanium gas ratio is approximately greater than 0.97.

10. The method of claim 1 further including:
    depositing a titanium layer directly on the dielectric prior to depositing the titanium nitride layer; and
    depositing the titanium nitride layer directly on the titanium layer, above the dielectric layer.

11. A method of forming a layer in a semiconductor device, said method comprising the following steps:
    depositing a dielectric layer on a surface of a semiconductor wafer;
    depositing a titanium nitride layer above the dielectric layer using a DC power less than 6.0 KW and a process pressure at about or above 5.6 mTorr;
    annealing the semiconductor device with a rapid thermal anneal; and
    depositing an interconnection layer over the titanium nitride layer.

12. The method of claim 11, wherein the low rapid thermal annealing temperature is below 600° Celsius.

13. The method of claim 11, further including:
    forming a titanium layer directly on top of the dielectric layer; and
    forming the titanium nitride layer over the titanium layer.

14. The method of claim 11, wherein the dielectric layer includes a boron phosphorus silicate glass layer.

15. The method of claim 11, wherein the interconnection layer includes an aluminum layer.

16. The method of claim 11, wherein the interconnection layer includes a tungsten layer.

17. A method comprising:
    forming a dielectric layer on a surface of a semiconductor substrate;
    depositing a layer of titanium nitride over the dielectric at a temperature, DC power and pressure that result in compressive stress within said layer following the deposition, said DC power being in the range of 5.0 to 6.5 KW and the pressure being in the range of 5.5 to 6.5 mTorr;
    performing rapid thermal anneal on said layer to transition the stress from compressive stress to a tensile stress, the tensile stress being less than a selected threshold amount following the rapid thermal anneal; and
    completing manufacture of the semiconductor device so as to form an operational device having a titanium layer with the tensile stress lower than said threshold value.

18. The method according to claim 17 when said tensile stress is less than approximately $1.25 \times 10^{10}$ dynes/cm$^2$ after the rapid thermal annealing.

* * * * *